AM-FM N-PATH FILTER ARRANGEMENT WITH CENTER FREQUENCY AND BAND WIDTH ADJUSTMENTS

Filed April 3, 1968

INVENTOR
ERIK LANGER

BY Hill, Sherman, Meroni, Gross & Simpson
ATTORNEYS

United States Patent Office 3,551,857

Patented Dec. 29, 1970

3,551,857

AM-FM N-PATH FILTER ARRANGEMENT WITH CENTER FREQUENCY AND BAND WIDTH ADJUSTMENTS

Erik Langer, Munich, Germany, assignor to Siemens Aktiengesellschaft, a corporation of Germany Filed Apr. 3, 1968, Ser. No. 718,469
Claims priority, application Germany, Apr. 11, 1967, S 109,285
Int. Cl. H03h *7/12;* H04b *1/16*
U.S. Cl. 333—70 7 Claims

ABSTRACT OF THE DISCLOSURE

A filtering arrangement which might be used, for example, in the intermediate stages of either an AM or FM receiver is disclosed and which utilizes N-path filters. Two embodiments are disclosed with the first one utilizing a parallel switch arrangement for switching from a first to a second frequency range and the second embodiment using a series switching arrangement for switching from a first to a second frequency range.

BACKGROUND OF THE INVENTION

Field of the invention

This invention relates in general to frequency selective means and in particular to intermediate frequency amplifiers capable of selecting signals in various frequency ranges.

Description of the prior art

When using conventional filters with coils and capacitors in radio receivers, individual filter elements must be intermeshed so that two frequency ranges may pass through the receiver. When using integrated circuits with RC filters without inductors, it is difficult to build intermediate frequency filters which have two separate pass bands. However, as more and more integrated circuits are utilized, a considerable need exists for filters without inductors.

SUMMARY OF THE INVENTION

The present invention relates to a frequency selective system that is capable of simultaneously passing signals in two frequency ranges. For example, radio receivers capable of detecting AM signals generally have an intermediate frequency of about 450 kHz. with a band width of 5–7 kHz. When a receiver is switched to FM reception, intermediate frequencies of 6.75, 8.25 or 10.7 mHz. are used with band width of 150 to 250 kHz. The present invention uses an N-path filter in a circuit arrangement with cycle switches and low pass filter sections which can be easily converted from AM to FM use and vice versa. Two modifications are shown, one in which a parallel switch bridges at least one component of resistance to shift the band width, and with the N-path filter switches connected in parallel. The second modification comprises an N-path filter with switches in series and with at least two low pass filter sections provided in each path which may be switched on the output side to obtain different frequency ranges.

Other objects, features and advantages of the present invention will be readily apparent from the following detailed description of certain preferred embodiments thereof taken in conjunction with the accompanying drawings.

DESCRIPTION OF THE PREFERRED EMBODIMENTS

The N-path filter which has been known in the prior art, has become particularly important with the need for integrated filters without inductors because it is stable and has low tolerance sensitivity. N-path filters comprise circuit arrangements consisting of switches which are cycled and low pass filter sections. The swtches are cycled by a cycle transmitter which may include electronic switches and the circuit components are assembled so that the low pass filter characteristic will be transformed into a band pass filter characteristic. Such circuits have a response between the input and output terminals like a filter with the frequency of cycling determining the band frequency. The article entitled "Time Multiplex Method for Filter Synthesis" in the magazine "Frequenz" (Frequency), volume 20 of 1966, No. 12, at pages 397 to 406, describes N-path filters.

The present invention discloses a use of N-path filters for use in receivers with several frequency ranges of varying band width. At least one N-path filter with variable band width is provided in the receiver for the solution of the problem.

The N-path filter may be designed with either parallel or series switches. In the case of an N-path filter with switches in parallel, the omic input resistance of the filter is divided into at least two components and one component of such resistance is shorted with a switch in order to shift the band width.

In the case of an N-path filter with switches in series, at least two low pass filter sections are provided in each path that may be selectably switched to obtain the different frequency ranges. The switching in the series path may be accomplished by electronic switches as, for example, semiconductor diodes such as SCRs, or the switches may be constructed within the circuitry of the low pass filter sections.

According to a special embodiment of the invention the intermediate frequency of a receiver may be adjusted by changing the scanning frequency of the N-path filter to obtain the desired frequency range.

When receiveing amplitude modulated signals, it is desirable to synchronize the cycle frequency by utilizing the output of the filter and a feedback loop.

Figure 1:
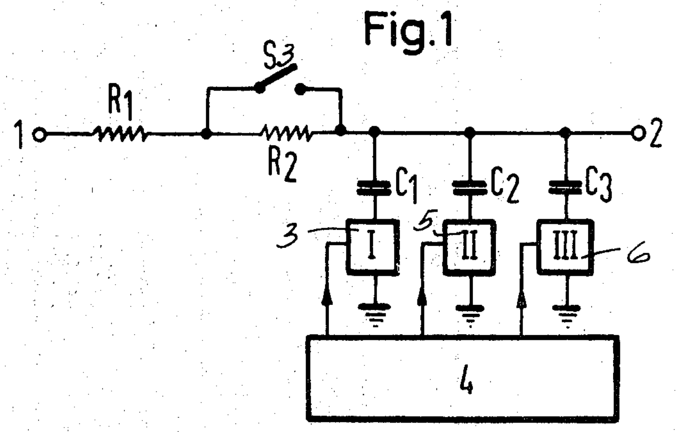
FIG. 1 is a schematic view of a frequency selecting arrangement which uses an N-path filter with parallel switches.

FIG. 1 shows an input terminal 1 which is connected to a first series resistor $R_1$. A second series resistor $R_2$ is connected to resistor $R_1$ and is bridged by a switch $S_3$. The other side of resistor $R_2$ is connected to an output terminal 2. A first capacitor $C_1$ is connected between the output terminal 2 and a first switch 3 that may, for example, be an electronic switch. The other side of the electronic switch 3 is connected to ground and its control electrode is connected to a cycle transmitter 4. A second condenser $C_2$ has one side connected to the output terminal 2 and its other side connected to a second electronic switch 5 which has its other side connected to ground and its control electrode connected to the cycle transmitter 4. A third capacitor $C_3$ has one side connected to the output terminal 2 and the other side connected to a switch 6 that has its other side connected to ground. The control electrode of the switch 6 also receives an input from the cycle transmitter 4. The pass band of the filter arrangement shown in FIG. 1 may be modified to obtain various band widths by closing the switch $S_3$ so that it bridges the resistor $R_2$. Thus, reception of AM and/or FM waves may be passed with the filter arrangement. For example, for FM reception the switch $S_3$ will be closed and the signal passed between input terminal 1 and output terminal 2 will be at a frequency and with a band width corresponding to FM requirements. When the switch $S_3$ is opened the circuit arrangement of FIG. 1 will pass AM signals and will have a pass band and a band width appropriate for passing such signals. Thus, it is seen that FIG. 1 allows the pass band and band width of a circuit to be easily adjusted from one to a second condition.

Figure 2:
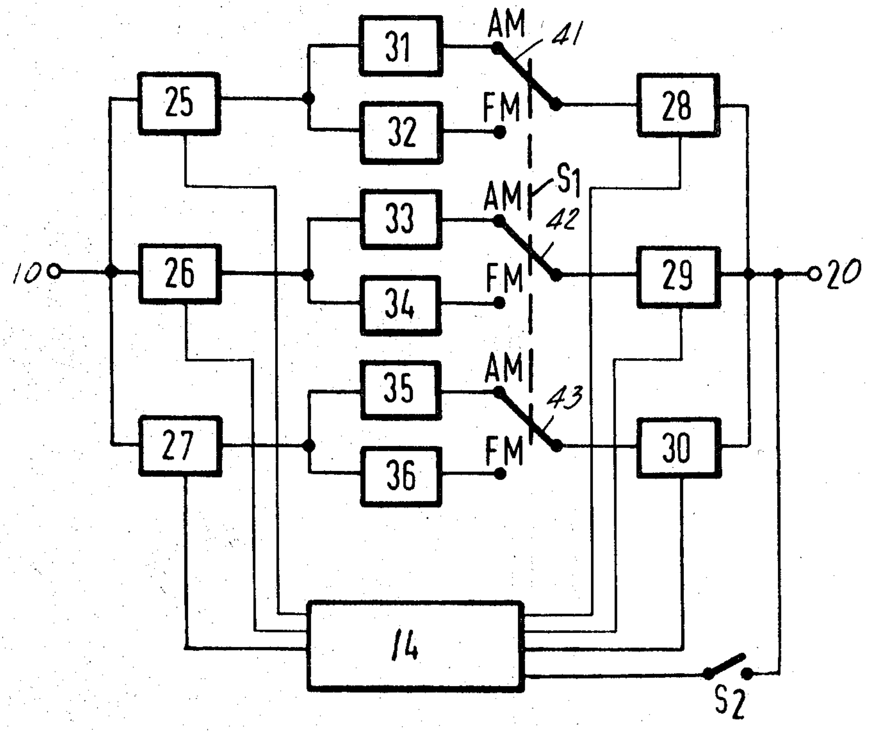
FIG. 2 illustrates a modification of the invention wherein series switches are utilized in the N-path filter circuit.

FIG. 2 illustrates a modification of the invention wherein series switches are utilized in the N-path filter arrangement. An input terminal 10 is connected to switches 25, 26 and 27 which might, for example, be electronic switches that have their control electrodes connected to a cycle transmitter 14. The output of the electronic switch 25 is connected to inputs of low pass filter sections 31 and 32. The output of switch 26 is connected to the inputs of low pass filter sections 33 and 34, and the output of switch 27 is connected to the inputs of low pass filter sections 35 and 36. A switch $S_1$ has three movable contacts 41, 42 and 43 which are respectively connected to switches 28, 29 and 30 that may also be electronic switches similar to the switches 25, 26 and 27. The control electrodes of the switches 28, 29 and 30 are also connected to the cycle transmitter 14 and have their outputs connected to the output terminal 20. Contact 41 is movable between the output of low pass filter sections 31 and 32. Switch contact 42 is movable between the output of low pass filter sections 33 and 34 and switch contact 43 is movable between the output of low pass filter sections 35 and 36. An output from the output terminal 20 is supplied through a switch $S_2$ to the cycle transmitter 14, shown in FIG. 2. This allows the cycle transmitter 14 to be synchronized with the output signal during operation with AM signals. Switch $S_2$ would thus be closed during the reception of AM signals and would be open during the reception of FM signals.

Although, in FIG. 2, separate low pass filter sections are utilized when switching from AM to FM reception, it is to be realized that the invention is not limited to such arrangement and that with switches constructed within the low pass filter sections switching may occur in the low pass filter sections themselves.

Although minor modifications might be suggested by those versed in the art, it should be understood that I wish to embody within the scope of the patent warranted hereon all such modifications as reasonably and properly come within the scope of my contribution to the art.

I claim as my invention:

1. A filter circuit adjustable to a plurality of frequency ranges with different band widths comprising, an N-path filter having:

(a) a plurality of low pass filter sections including capacitors and at least two resistors,
(b) a plurality of switches connected in circuit with said low pass filter sections,
(c) means for adjusting the center frequency of said N-path filter, and
(d) means for adjusting the band widths of said N-path filter comprising a switch connected in parallel with one of said resistors.

2. A filter according to claim 1 wherein said plurality of switches are connected in circuit with said capacitors and the capacitors and switches are connected in a parallel portion of said filter.

3. A filter according to claim 1 wherein said plurality of switches are electronic switches.

4. A filter according to claim 3 wherein said electronic switches are formed of semiconductors.

5. A filter circuit adjustable to a plurality of frequency ranges with different band widths, comprising an N-path filter having:

(a) an input,
(b) an output,
(c) a plurality of low pass filter sections grouped in pairs,
(d) a plurality of switches connected in circuit with said filter sections,
(e) each switch of a first portion of said plurality of switches connected between said input and a separate pair of said filter sections,
(f) transfer switch means including a plurality of transfer switches each having a movable contact and each having a pair of contacts individually connected to the switches of a separate pair of switches,
(g) each switch of a second portion of said plurality of switches connected between a separate movable contact and said output,
(h) means for adjusting the center frequency of said N-path filter including a cycle transmitter connected to each of said plurality of switches, and
(i) means for adjusting the band widths of said N-path filter.

6. A filter according to claim 5 including synchronizing means selectively connected between the output of said second portion of said plurality of switches and said cycle transmitter.

7. A filter according to claim 6, wherein said cycle transmitter includes a synchronizing input and said synchronizing means comprises synchronizing switch means connected between said output of said N-path filter and said synchronizing input of said cycle transmitter.

References Cited

UNITED STATES PATENTS

| | | | |
|---|---|---|---|
| 2,485,567 | 10/1949 | Clark | 333—70A |
| 2,510,072 | 6/1950 | Clark | 333—70A |
| 2,521,690 | 9/1950 | Clark | 333—70A |
| 2,535,040 | 12/1950 | Clark | 333—70A |
| 2,584,986 | 2/1952 | Clark | 333A |

OTHER REFERENCES

Le Page et al., "Analysis of a Comb Filter Using Synchronously Commutated Capacitors," A.I.E.E. Trans. Part 1, 72, 1953, pp. 63–68.

Franks et al., "An Alternative Approach to the Realization of Network Transfer Functions: The N-Path Filter," Bell System Tech. Journal, September 1960, pp. 1321–1350.

Busignies et al., "Some Relations Between Speed of Indication, Bandwidth, and Signal-to-Random-Noise Ratio in Radio Navigation and Direction Finding," Proc. IRE, vol. 37, May 1948, pp. 478–488.

Langer, E., "Zeitmultiplexverfahren Zur Filtersynthese," Frequenz BD20, 1966, pp. 396–406.

ELI LIEBERMAN, Primary Examiner

W. H. PUNTER, Assistant Examiner

U.S. Cl. X.R.

325—316, 427, 462